United States Patent [19]

Eisele et al.

[11] 4,141,030
[45] Feb. 20, 1979

[54] HIGH-POWER SEMICONDUCTOR ASSEMBLY IN DISK-CELL CONFIGURATION

[75] Inventors: Dieter Eisele; Klaus Weimann, both of Lampertheim, Fed. Rep. of Germany

[73] Assignee: BBC Brown Boveri & Company Limited, Baden, Switzerland

[21] Appl. No.: 751,480

[22] Filed: Dec. 16, 1976

[30] Foreign Application Priority Data

Dec. 17, 1975 [DE] Fed. Rep. of Germany ....... 2556749

[51] Int. Cl.² .................... H01L 23/42; H01L 23/44; H01L 23/46
[52] U.S. Cl. .................................... 357/79; 357/74; 357/81
[58] Field of Search .............................. 357/74, 79, 81

[56] References Cited
U.S. PATENT DOCUMENTS

| | | | |
|---|---|---|---|
| 3,293,508 | 12/1966 | Boyer | 357/79 |
| 3,581,163 | 5/1971 | Eriksson | 357/79 |
| 3,597,524 | 8/1971 | Schreiner | 357/79 |
| 3,800,192 | 3/1974 | Eisele et al. | 357/79 |
| 3,852,803 | 12/1974 | Walmet et al. | 357/79 |
| 3,885,243 | 5/1975 | Weisshaar | 357/79 |

Primary Examiner—Andrew J. James
Attorney, Agent, or Firm—Oblon, Fisher, Spivak, McClelland & Maier

[57] ABSTRACT

A high-power semiconductor assembly of the disk-cell construction has an insulating housing and exhibits electrical and thermal pressure-contacting of the semiconductor chip. At least two zones of different conduction types are provided within the chip and the same is clamped, in an essentially doubly symmetrical arrangement with respect to the mid-plane of the chip and the central axis perpendicular thereto, with the interposition of pressure plates, heat-conducting paste, and electrodes, particularly cup-shaped electrodes with their open sides disposed away from the main surfaces of the semiconductor chip, and between two terminal electrodes serving as heat sinks.

5 Claims, 2 Drawing Figures

HIGH-POWER SEMICONDUCTOR ASSEMBLY IN DISK-CELL CONFIGURATION

BACKGROUND OF THE INVENTION

1. Field of the Invention

The present invention relates generally to semi-conductor assemblies and more particularly to high-power semiconductor assemblies for application in power supplies.

2. Description of the Prior Art

By the terms "disk-cell construction" or "disk-cell", there is meant in the present connection a disk-shaped semiconductor chip enclosed, with the interposition of electrodes and conducting plates, if necessary, in an insulating housing. Such high-power semiconductor components are generally known, such as, for example, from VDI-Zeitschrift 107 (1965), No. 34 – December, p. 1656, DT-PS 2,039,806. From the first-mentioned source it is further known how to clamp the disk cell between heat sinks of mushroom-like cross section, and, depending upon the desired current-carrying capacity, to provide ambient-air cooling, forced-air cooling, or liquid cooling.

From DT-PS 2,039,806 it is known how to use ductile, cup-shaped electrodes of silver. The open sides of the cup-shaped electrodes are disposed away from the main surfaces of the semiconductor chip. In this way, and by adjustment of the diametrical ratios and material thicknesses, a uniform pressure distribution and symmetry with respect to the central axis of the semiconductor component is obtained.

It is also to be noted in this connection that the aforementioned "essentially doubly symmetric arrangement" is to be so understood that, for example, for a power thyristor, a control terminal is to be provided which rather strongly affects the housing symmetry, if necessary, but which only slightly affects the pressure symmetry. Such disk-cells with a central control terminal (central gate) are also known (DT-OS 2,246,423).

The cooling of semiconductor components is described further in the "Silicon Rectifier Handbook" of Brown Boveri & Co., Baden (Switzerland) of 1971. FIG. 1 shows a known design of a power diode in disk form. There, 1 indicates the silicon semiconductor chip, 2 the electrodes of silver, for example, 3 the conducting plates consisting possibly of tungsten or molybdenum, and 4 the terminal electrodes or heat sinks consisting of copper, for instance.

It is known in this connection (DT-OS 1,944,181) how to avoid the use of any contact-making material between the parts 1 to 4, and to produce the contact for current passage and heat conduction by inward pressure on the element, for example, by clamping between two special heat sinks. The terminal electrodes can themselves be heat sinks or part of a heat sink or again be pressure-contacted with heat sinks. To the extent shown in FIG. 1, the component exhibits three heat-transmission resistances on each side which may be denoted by $R_{v_1} - R_{v_3}$. They each arise at the transition from one material to the other, they are pressure, surface and material dependent, and the electrical output of the component essentially depends on their magnitudes.

It is additionally known (DT-PS 2,220,682) how to reduce these thermal resistances by introducing heat-conducting paste or grease between the pressure-contact materials. This sharply reduces the electrical conductivity, however. An improvement can be made in this respect by mixing metal powder with the heat-conducting paste or grease so as to increase the electrical conductivity. With prolonged operation of such semiconductor components, however, the heat-conducting paste or grease is decomposed by means of the current, leading to a rise in the thermal resistance.

SUMMARY OF THE INVENTION

On the basis of the aforementioned high-power semiconductor component (DT-PS 2,039,806) it is the object of the present invention to achieve, by arrangement and structure of the mentioned parts of the component, good thermal conductivity along with good electrical conductivity.

The solution is, in accordance with the invention — with reference to the mid-plane of the semiconductor chip — that the removal of the generated heat is separated form the current path at at least one pressure-contact junction.

In connection with pressure contacting it is indeed known how to use spring arrangements serving as both electrical and thermal contacts (GB-PS 777,985), as well as a spring system (saddle spring) that is not part of the current path (DT-AS 1,248,813); in these cases however, disk cells like those in the VDI-Zeitschrift and DT-PS 2,039,806 are not involved.

The decoupling of heat and current paths is advantageously achieved as the object of the present invention by an arrangement such that the electrode is pressed into thermal and electrical contact with the semiconductor chip and thermal contact with the pressure plate, the latter is pressed into thermal contact with the terminal electrode, and the electrode by-passing the main heat flow is electrically connected with the terminal electrode. Of course, the current path represents a shunt path for the heat flow but it is negligible compared to the heat flow across the large junction surface.

Preferably starting with a semiconductor component with cup-shaped electrodes, the side of the electrode disposed away from the semiconductor chip is electrically joined to a electrically conducting ring element which is, in turn, electrically joined to the terminal electrode.

It is advantageous for the turned-up edge of the round portion of the electrode contacting the semiconductor chip to extend to the point of connection with the ring element, with a stepwise increase in the diametrical extent thereof, with portions disposed partially parallel to the mid-plane and partially coaxial with the central axis of the semiconductor chip. The ring element likewise is advantageously cup-shaped with a partially open bottom surroundingly supporting the terminal electrode. The terminal electrode can be made disk-shaped, and the connection to a surrounding piece can also be made by means of flanges provided at the outer diameter of the terminal electrode.

BRIEF DESCRIPTION OF THE DRAWINGS

Various objects, features and attendant advantages of the present invention will be more fully appreciated as the same becomes better understood from the following detailed description of the present invention when considered in connection with the accompanying drawings, in which.

DETAILED DESCRIPTION OF A PREFERRED EMBODIMENT

Figure 1:
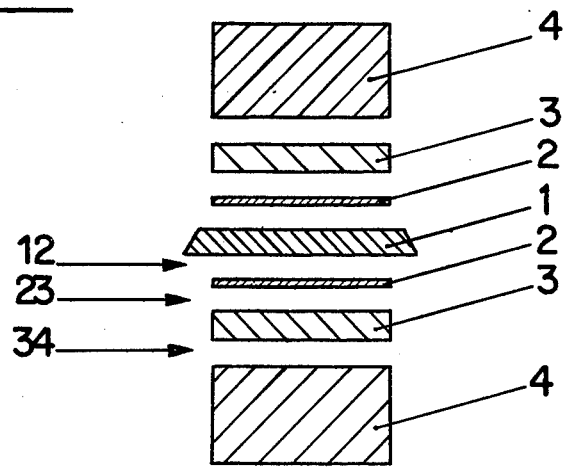
FIG. 1 is an exploded view of a known disk diode.
Figure 2:
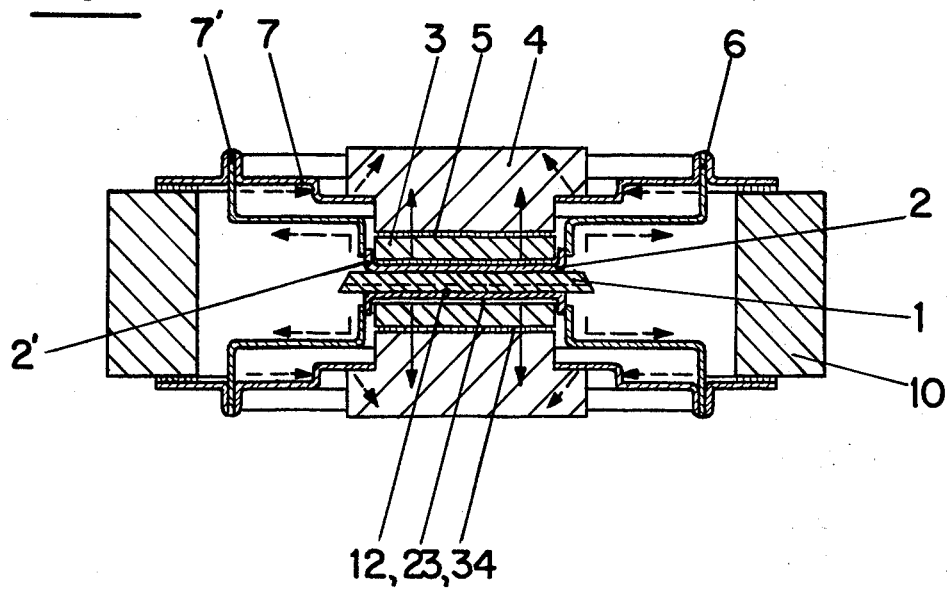
FIG. 2 shows a cross-sectional view of a disk-cell-type high-power semiconductor assembly constructed in accordance with the present invention.

Referring now to FIG. 2, there is shown, merely by way of example, a semiconductor chip 1 with only one pn-junction which is schematically designated as the dotted line, and it is to be noted that the concept of the invention can readily be realized in the form of a power thyristor as well as in the example of a power diode.

Between the pressure plates 3, which may be, for example, molybdenum disks, and the cup-shaped electrodes 2, consisting, for example, of silver, on the one hand, and between the terminal electrodes 4, made of, for example, copper, and plates 3 on the other hand, there are disposed heat-conducting layers 5, made of, for example, a heat-conducting paste with a silicone base.

The current-supply electrode 6 for the silicon semiconductor chip is provided with a radially inner, annular contact surface for contacting the electrode 2 through means of a turned up or flanged edge portion 2', and is also provided with diametrically stepped portion which can be soldered where desired to cup-shaped ring elements 7, fabricated preferably of a nickel-iron alloy, which is obtainable under the brand names "Vacon" or "Vacodil" from the Vacuum-Schmelze Works, German Federal Republic, Hanau, or alternatively, may be made of copper or iron. The cup-shaped ring elements are electrically connected to the outer portions of the copper terminal electrodes 4 which can themselves be joined to or clamped in heat sinks, not shown.

The heat flow upon both sides of the semiconductor chip 1 is indicated by means of the solid arrows, while the current is similiarly indicated by the dashed arrows. Between the semiconductor chip 1 and the electrodes 2 there are formed current and heat junctions 12, and it is apparent that at the pressure-contact junction between electrodes 2 and the pressure plates 3, and between the pressure plates 3 and the terminal electrodes 4, only heat is transferred with the thermal resistances 23 and 34, respectively. The high-power semiconductor component also has a self-evident, annular discoid type insulating housing 10 which may be, for example, made of ceramic.

Obviously, numerous modifications and variations of the present invention are possible in light of the above teachings. It is therefore to be understood that within the scope of the appended claims, the invention may be practiced otherwise than as specifically described herein.

What is claimed as new and desired to be secured by Letters Patent of the United States is:

1. A high-power semiconductor assembly comprising:
   said assembly is of a disk-cell construction disposed within an insulating housing, and exhibits electrical and thermal pressure-contacting of a semiconductor chip assembly;
   said chip assembly including a semiconductor chip of at least two zones of different conduction types, being clamped and interposed between pairs of pressure plates, heat-conducting layers and electrodes, the latter of which are cup-shaped with the open-sides thereof disposed away from the main surfaces of the semiconductor chip; and
   the chip assembly has an essentially doubly symmetric arrangement with respect to the mid-plane of the semiconductor chip and the central axis thereof disposed perpendicular thereto and is interposed between two main terminal electrodes serving as heat sinks, and wherein further, with respect to said chip mid-plane, the main path for the removal of generated heat is separated from the main path of the current at at least one pressure-contact junction formed by said electrodes and said pressure plates.

2. A high-power semiconductor assembly as set forth in claim 1, wherein:
   each of the electrodes is thermally and electrically pressure-contacted with the semiconductor chip and thermally contacted with the pressure plate;
   the pressure plate is thermally pressure-contacted with the main terminal electrode; and
   the electrode, apart from the heat flow, is electrically connected with the main terminal electrode.

3. A high-power semiconductor assembly as set forth in claim 1, wherein:
   the peripheral open edges of said main electrodes disposed away from the semiconductor chip are electrically connected with an electrically conducting ring element, which is, in turn, electrically connected with the main terminal electrode.

4. A high-power semiconductor assembly as set forth in claim 3, wherein:
   the turn-up or open edge of the round part of the electrode resting against the semiconductor chip is extended to the point of connection with the ring element by means of a stepwise-increased diametrical member or portion which is partially disposed to the mid-plane of said chip and partially disposed coaxial with the central axis of the semiconductor chip; and
   the ring element is likewise cup-shaped with a partially open bottom surrounding and supporting the main terminal electrode.

5. A high-power semiconductor assembly as set forth in claim 3, wherein:
   the electrically conducting ring element is replaced by means of a cup that rests against the pressure plate in place of the main terminal electrode.

* * * * *